United States Patent [19]

Anagnostopoulos et al.

[11] 4,330,796
[45] May 18, 1982

[54] BLOCK READABLE CHARGE COUPLED DEVICE

[75] Inventors: Constantine N. Anagnostopoulos, Mendon; Teh-Hsuang Lee, Webster; Bruce C. Burkey; James P. Lavine, both of Rochester, all of N.Y.

[73] Assignee: Eastman Kodak Company, Rochester, N.Y.

[21] Appl. No.: 116,686

[22] Filed: Jan. 30, 1980

[51] Int. Cl.³ .............................................. H04N 3/14
[52] U.S. Cl. .................................................. 358/213
[58] Field of Search ...................................... 358/213

[56] References Cited
U.S. PATENT DOCUMENTS

| | | |
|---|---|---|
| 3,995,107 | 11/1976 | Woywood ............................ 358/213 |
| 4,081,843 | 3/1978 | Okano ................................. 358/213 |
| 4,117,510 | 9/1978 | Ohta et al. ............................ 358/44 |
| 4,159,488 | 6/1979 | Tanaka et al. ....................... 358/213 |
| 4,280,141 | 7/1981 | McCann et al. ..................... 358/213 |

OTHER PUBLICATIONS

"Charge Transfer Devices", Hobson, Halsted Press, 1978, pp. 169–172.
"A Meander Channel CCD Linear Image Sensor", *IEEE*, Journal of Solidstate Circuits, vol. SC-13, No. 1, Feb. 1978, p. 66.

*Primary Examiner*—Richard Murray
*Attorney, Agent, or Firm*—Thomas H. Close

[57] ABSTRACT

In accordance with the present invention, a conventional area image sensor of the interline transfer type is so configured as to be readable in blocks of adjacent photosite rows, thereby enabling the modified sensor to be read out at fast frame rates. The resulting sensor, although designed for block readout, can be produced using conventional manufacturing processes.

17 Claims, 37 Drawing Figures

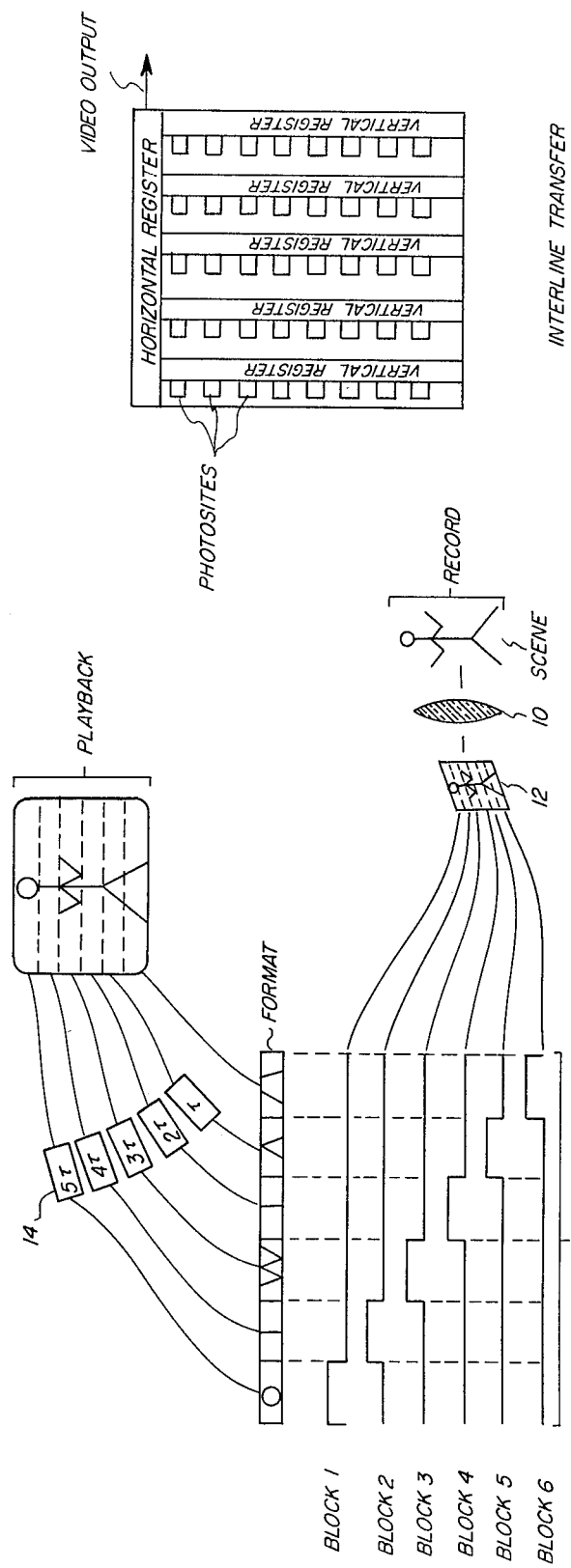

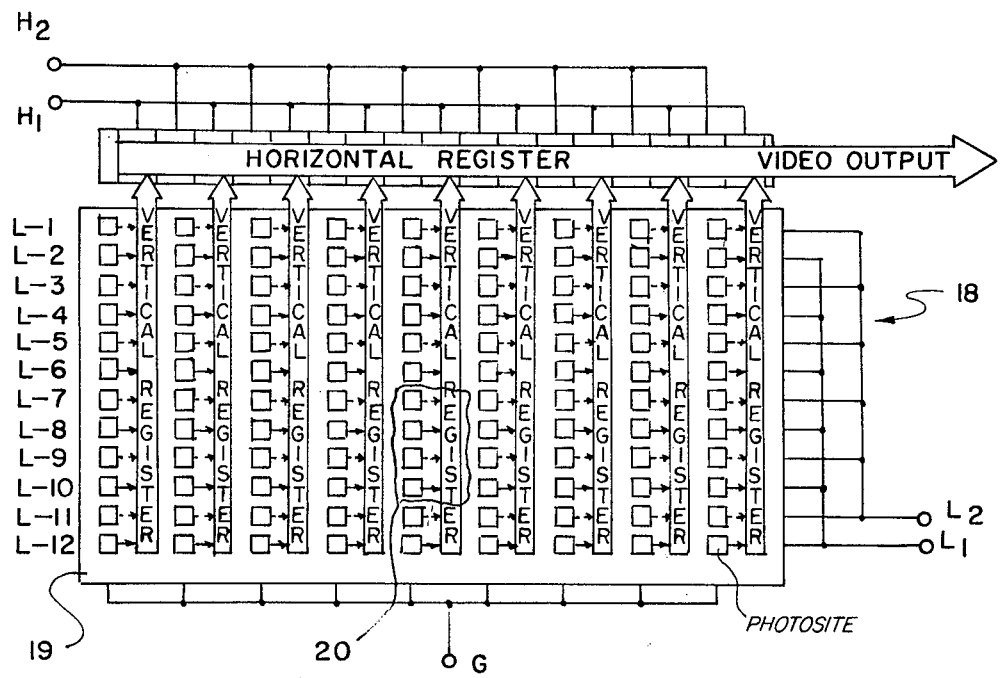
FIG. 3
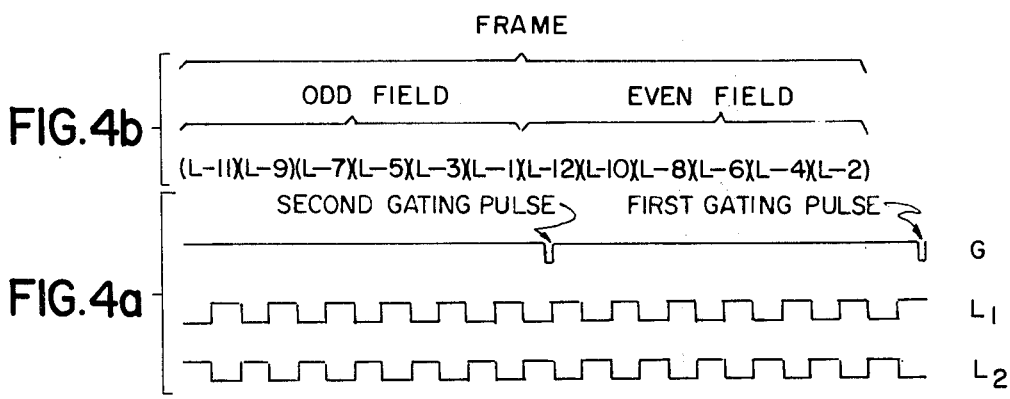
FIG. 4b
FIG. 4a

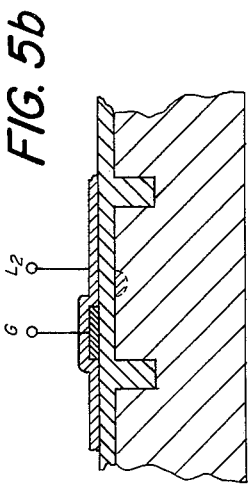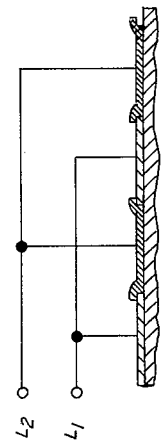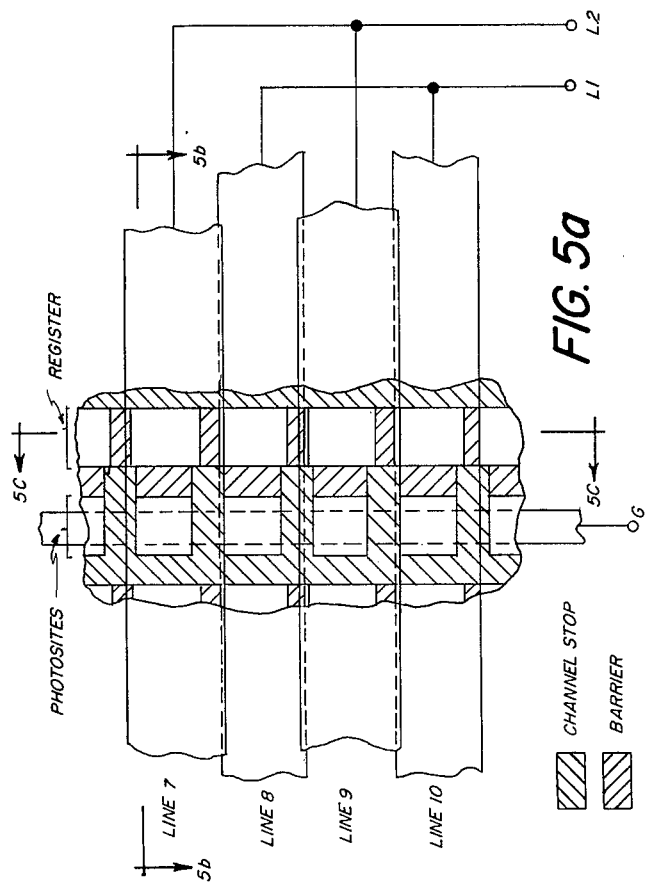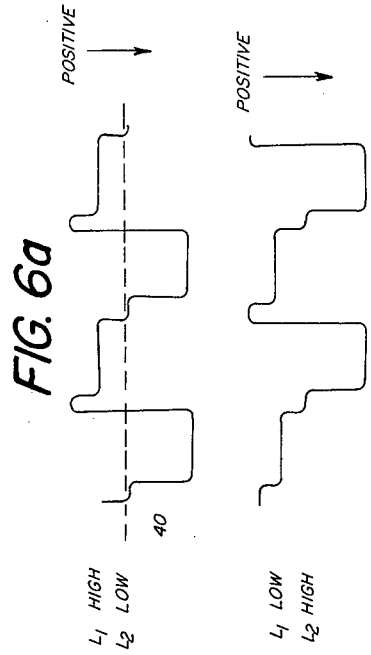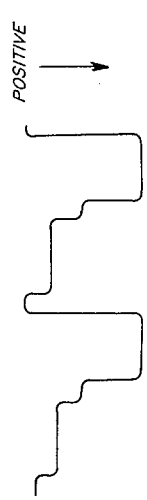

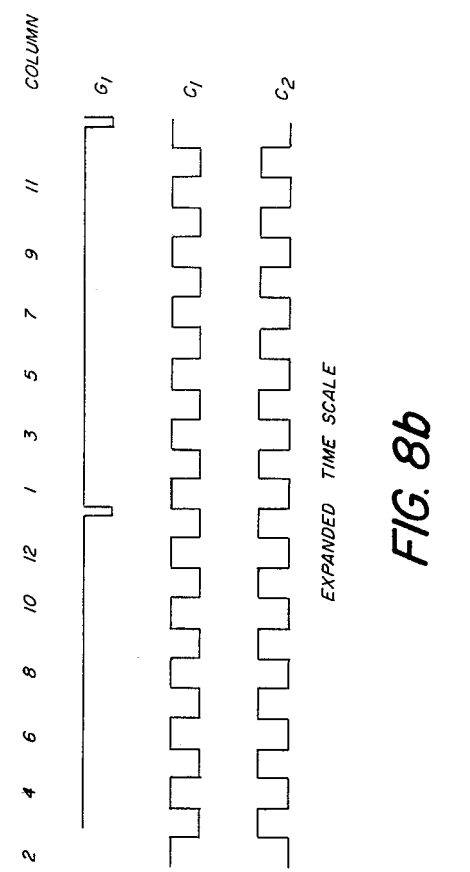
FIG. 8b
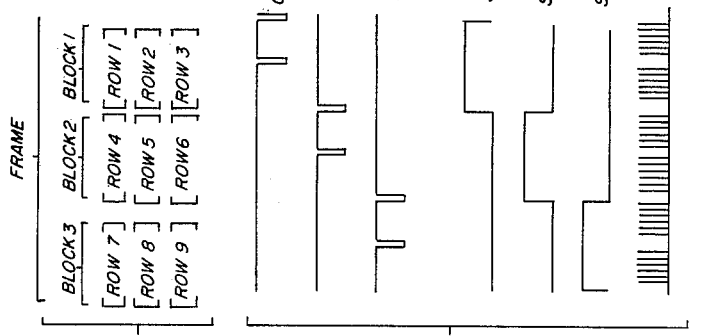
FIG. 8c
FIG. 8a

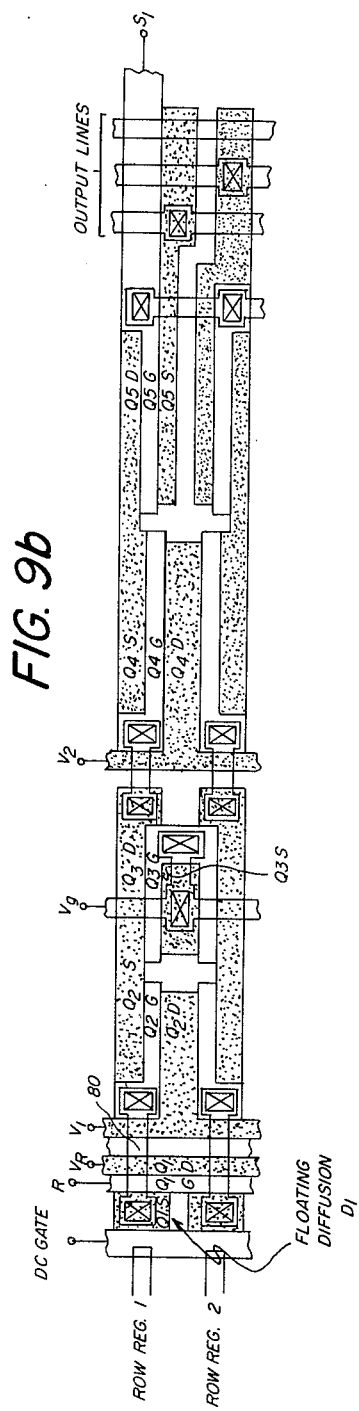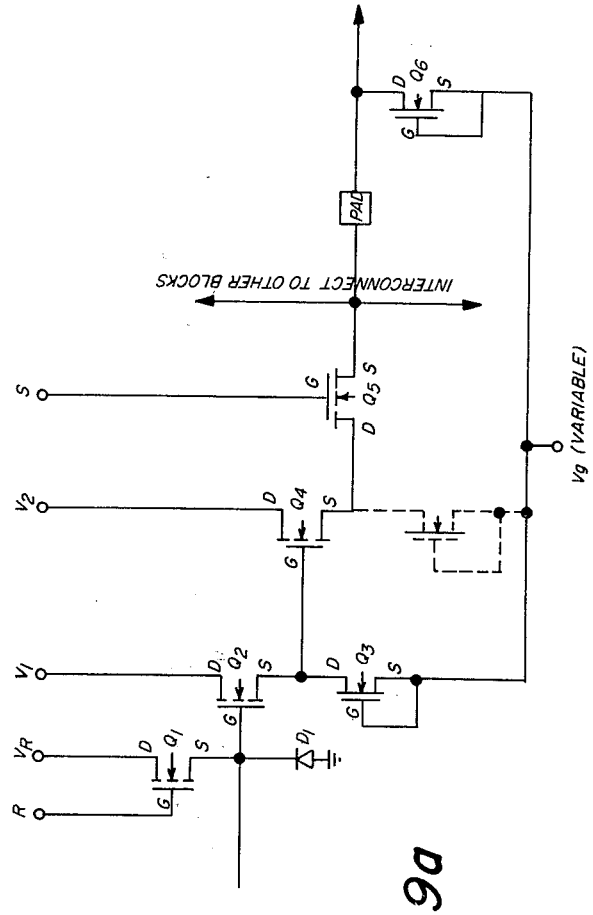

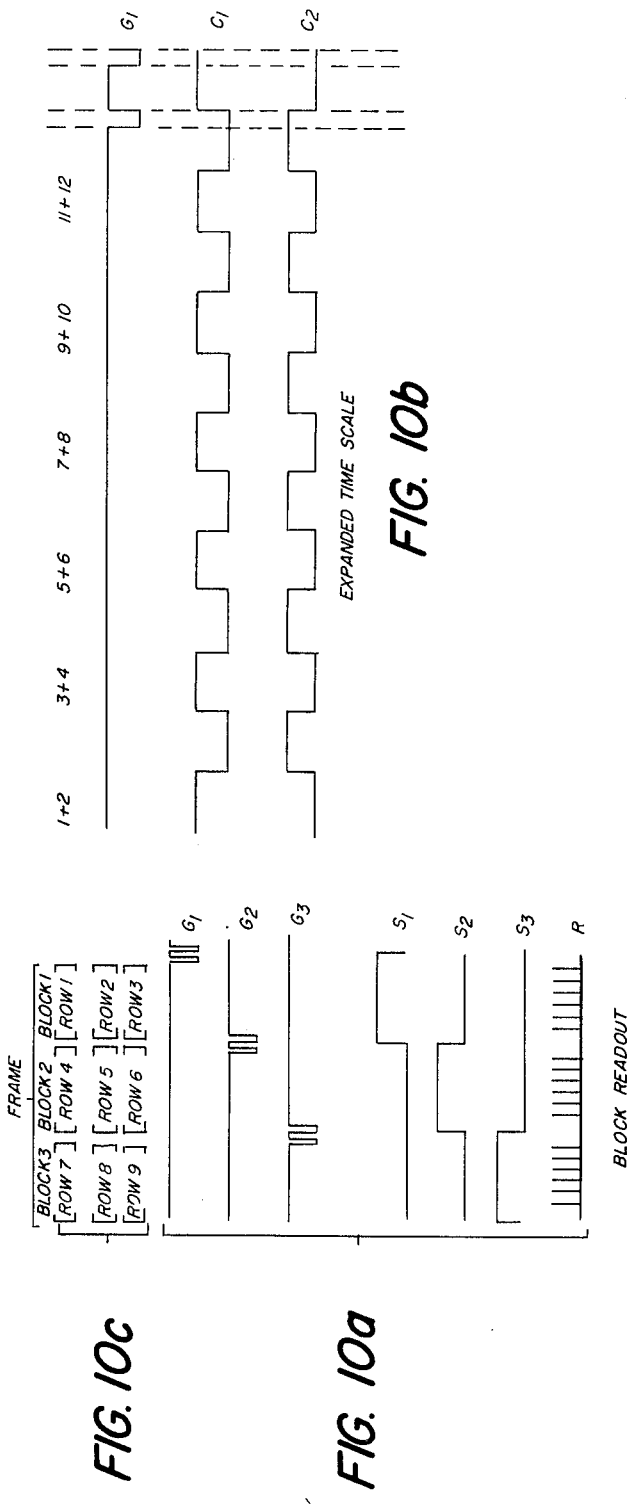

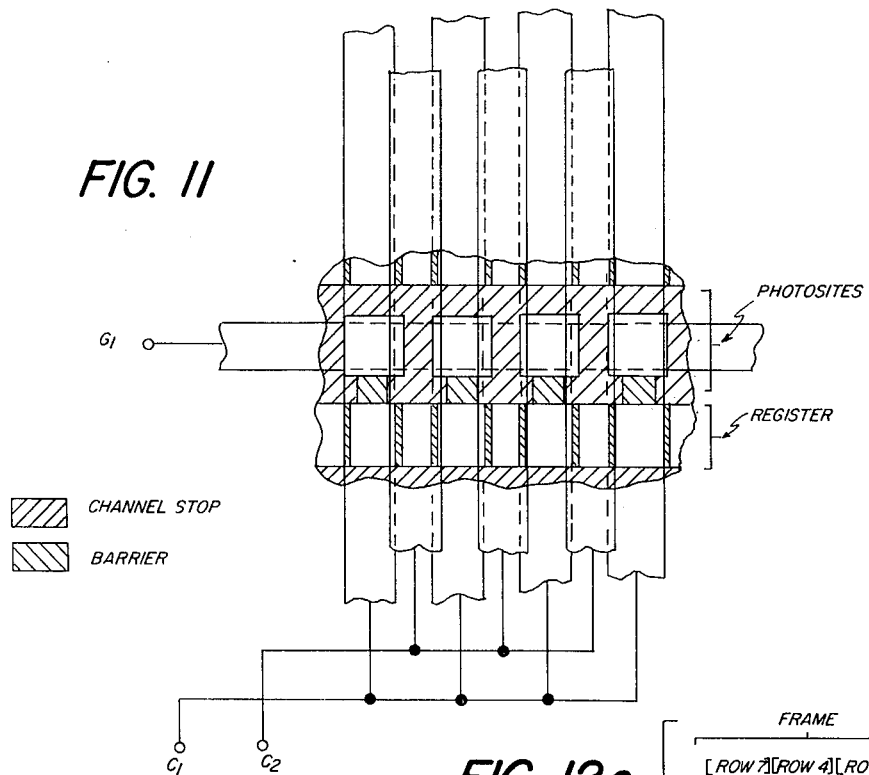
FIG. 11
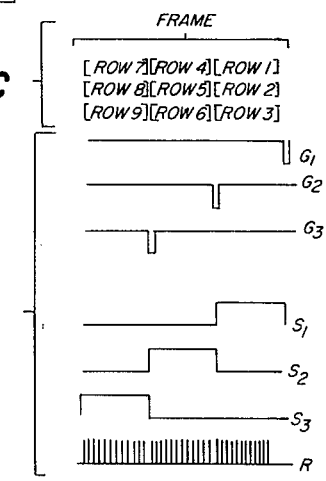
FIG. 12c
FIG. 12a
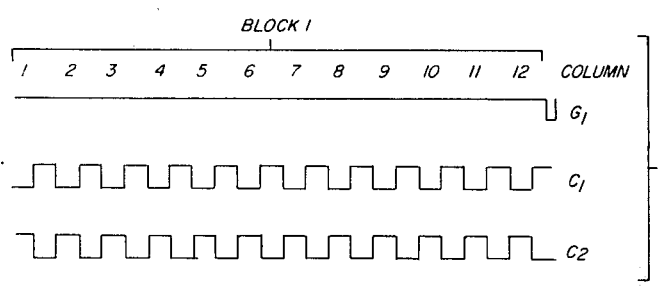
FIG. 12b

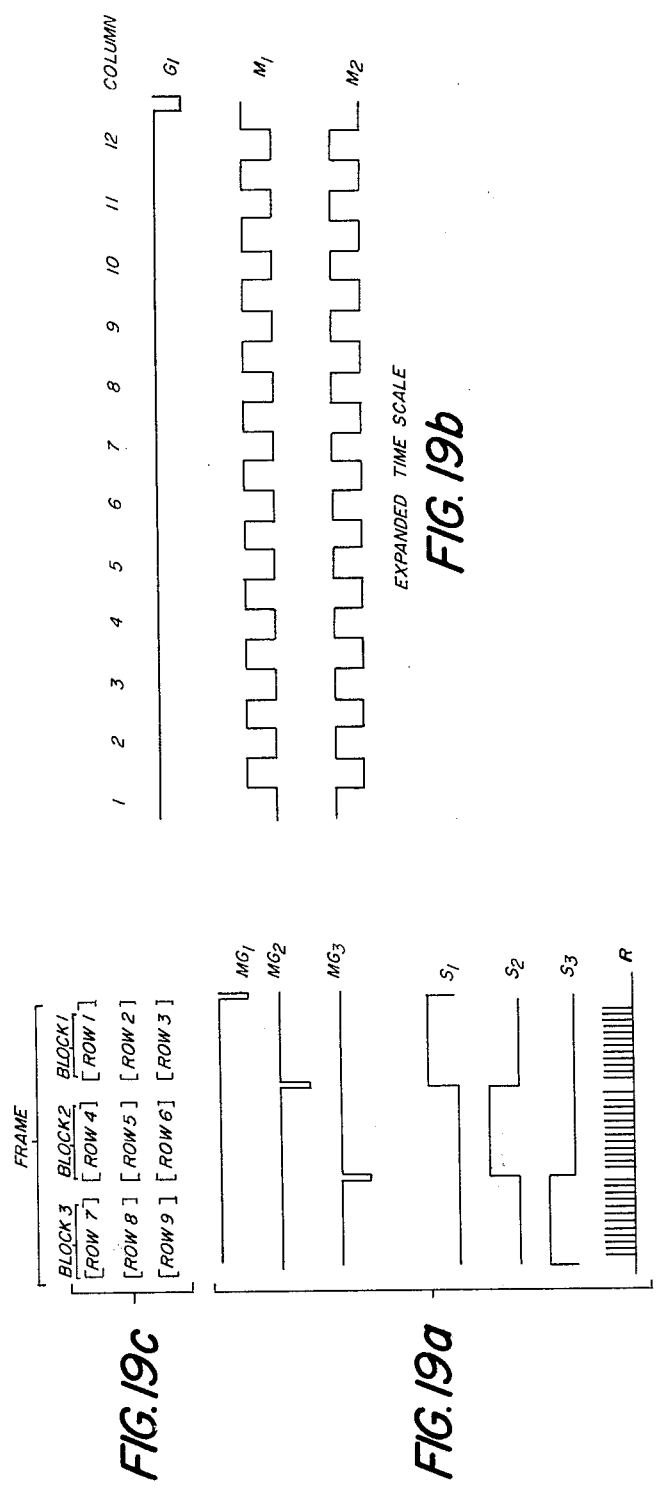

BLOCK READABLE CHARGE COUPLED DEVICE

FIELD OF THE INVENTION

The present invention relates to an area image sensor of the interline transfer type that has been designed for readout in blocks of photosite rows.

DESCRIPTION RELATIVE TO THE PRIOR ART

The use of solid-state area image sensors in video cameras has become increasingly popular in recent years. Such cameras are lighter, more compact and more reliable than their "tube-type" counterparts that use vidicons, orthicons or other electron tube devices for image sensing. Conventional solid-state sensors provide acceptable resolution and are readable at the standard video frame rate of 30 frames per second.

For certain applications much faster frame rates are required. For example, recording the motion of a rapidly moving object (such as a bullet) requires a frame rate high enough to "freeze" the object; if the object is not "frozen", successive frames will tend to smear into each other. As will be appreciated, the required frame rate generally depends upon the particular application and the amount of image smear that can be tolerated. In certain industrial applications, such as recording a test car crash under simulated conditions, or the breaking of a bottle during a manufacturing process, frame rates as high as 2,000 frames per second, or more, are desired.

Fast frame readout of a high resolution, solid-state area image sensor is not possible using standard readout methods (e.g., line transfer, frame transfer, and interline transfer, discussed, for example, in Hobson, "Charge-Transfer Devices", published by Halstead Press, 1978, pages 169-172) because the data rate at which such solid-state sensors can be read out is limited to about 10 MHz. If one frame contains 60,000 picture elements (pixels), for example, the maximum frame rate obtainable would be about 120 frames per second. At present, therefore, there are no video cameras using high resolution, solid-state area image sensors that operate at frame rates much in excess of 120 frames per second.

U.S. patent application Ser. No. 112,483, filed Jan. 16, 1980 in the name of James A. Bixby, discloses a method of obtaining a fast frame rate from a solid-state area image sensor. In accordance with that disclosure, the sensor is read out in "blocks" of photosites, with each block being comprised of a plurality of adjacent photosite rows. The output signal so produced is, therefore, comprised of block information in a "serial" format, while the information content of each block is comprised of a plurality of line signals in a "parallel" format, such line signals corresponding to the individual photosite rows within that block.

A specific sensor suitable for block readout is disclosed in U.S. patent application Ser. No. 112,482 entitled "Area Image Sensor Adaptable for Fast Frame Readout", filed Jan. 16, 1980 in the names of T. H. Lee and R. P. Khosla. The disclosed sensor is a MOS photocapacitor array wherein charges integrated at photosites within a given row are transferred sequentially into a common read channel upon column address. The sensor is so configured that a plurality of adjacent rows are read out together. In a specific example, a sensor is disclosed that has 192 rows divided, for purposes of readout, into six blocks of 32 rows each. The resultant output signal, therefore, is comprised of six blocks of information in a serial format, with each block of information being comprised of 32 row signals arranged in parallel.

SUMMARY OF THE INVENTION

The sensor disclosed in U.S. patent application Ser. No. 112,482 performs satisfactorily for a MOS photocapacitor array. There are, however, certain advantages, e.g., higher signal-to-noise ratio, inherent in charge coupled devices, that make a block readable device of the charge coupled type highly desirable. The present invention provides such a device by modifying a conventional, interline transfer charge coupled device so that it is readable in blocks of photosite rows. Importantly, the disclosed modifications are of such a nature that the modified block readable device can be produced using basically the same, and already perfected, manufacturing processes that are used to produce the unmodified device.

BRIEF DESCRIPTION OF THE DRAWINGS

In the detailed description of the preferred embodiments of the invention presented below, reference is made to the accompanying drawings, in which:

FIG. 1 is a graphical illustration of the concept of block readout;

FIG. 2 is a schematic diagram of a conventional interline transfer charge coupled device;

FIGS. 3, 4a, 4b, 5a, 5b, 5c, 6a and 6b are drawings useful in describing the general operation of an interline transfer charge coupled device such as the Fairchild CCD201 and CCD211, available from Fairchild Camera and Instrument Corp., Mountain View, California;

FIGS. 7, 8a, 8b and 8c are drawings that illustrate modifications, in accordance with the present invention, to the device shown in FIG. 3 that make such a device block readable;

FIG. 9a is a schematic diagram of an electrical circuit used in the modified device shown in FIG. 7, and FIG. 9b shows an integrated circuit implementation of such circuit;

FIGS. 10a, 10b and 10c are useful in describing an alternate method for reading out the device shown in FIG. 7;

FIGS. 11, 12a, 12b and 12c are drawings that illustrate further modifications, in accordance with the present invention, to the device shown in FIG. 7, and to its method of readout;

FIGS. 18, 19a, 19b and 19c are drawings that illustrate the design, in accordance with the present invention, for a meander channel charge coupled device that is block readable.

DETAILED DESCRIPTION OF THE PREFERRED EMBODIMENTS

Figure 7:
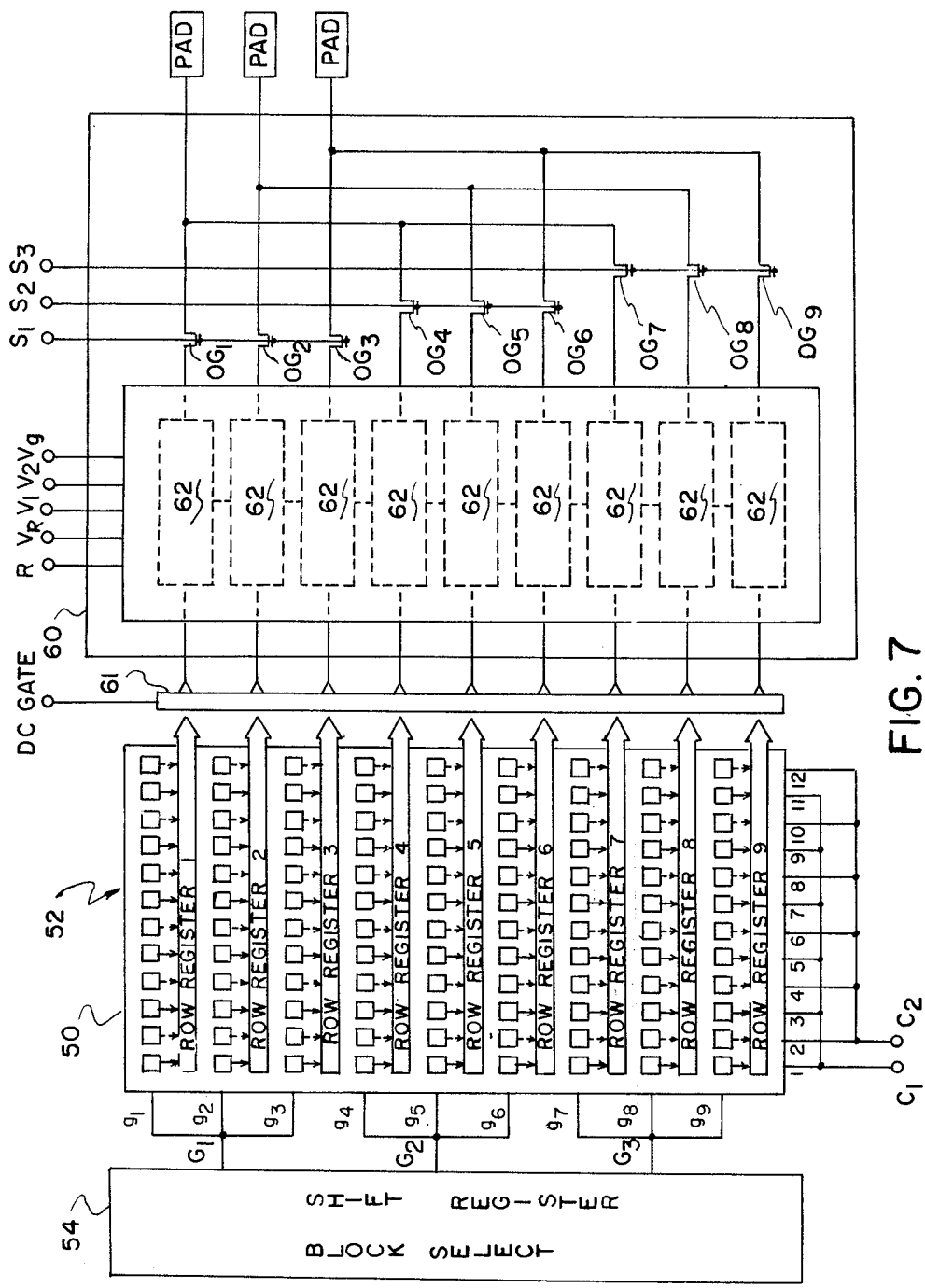

The basic concept of block readout is illustrated in FIG. 1. A scene is imaged by an optical system 10 onto an area image sensor 12. The sensor 12 is divided, for purposes of readout, into six blocks with each block being comprised of a plurality of photosite rows. As each block is enabled by a respective block enable pulse, all photosite rows within the enabled block are read simultaneously (i.e., in "parallel"). The frame information (labelled FORMAT) corresponding to each block is shown in "pictorial form" directly above its respective block enable pulse. By the use of appropriate delay circuits 14, the blocks of frame information are recombined to form the complete playback video display.

The present invention is directed to block readout of an area image sensor of a particular type: an interline transfer charge coupled device (CCD). Referring to FIG. 2, imaging a scene onto a conventional interline transfer CCD causes charge to be accumulated at photosites. The amount of charge accumulated per unit time at each photosite is proportional to the intensity of radiation, thereby producing a spatial charge distribution representative of scene illuminance. According to the conventional method of readout, the accumulated charge pattern is transferred periodically into vertical registers and shifted, a line at a time, into a horizontal register from which a line-by-line video output signal is taken.

In accordance with the present invention, certain modifications are made to a conventional interline transfer CCD which enable the device to be read out in blocks of photosite rows. An interline CCD so modified is not only readable at fast frame rates, but, additionally, yields certain advantages over the block readable MOS photocapacitor array disclosed in U.S. patent application Ser. No. 112,482, discussed above. For example, the area image sensor disclosed in U.S. patent application Ser. No. 112,482 includes a read channel that runs the length of each photosite row. Charges accumulated at photosites within a given row are sequentially dumped into this read channel upon column address. The resulting potential increase of the read channel is electrically sensed to provide output signal information. Because each read channel is long (extending the entire length of a photosite row), it has a relatively large capacitance. This large capacitance limits the signal level since the potential produced by a fixed number of charges is inversely proportional to capacitance, i.e., $V = q/C$. In an interline transfer CCD modified in accordance with the invention, the signal is taken from an output diffusion that is orders of magnitude smaller than the above discussed read channel. As a result, the capacitance is much smaller and (since $V = q/C$) the signal level is increased substantially. A further advantage is that the smaller output diffusion of an interline CCD modified in accordance with the invention picks up less clock noise than the read channel structure disclosed in U.S. patent application Ser. No. 112,482. The combined advantages of higher signal level and lower clock noise are responsible for a much improved signal-to-noise ratio (SNR).

In accordance with certain embodiments of the invention to be discussed directly below, an interline transfer CCD such as a Fairchild CCD201/211 is modified for block readout. Modification of an existing interline transfer CCD to a block readable CCD has the important advantage that the basic manufacturing technology is already available.

An interline transfer CCD 18, similar to the Fairchild CCD201/211, is shown in FIG. 2. For ease of explanation, the device depicted is a 12×9 array of photosites, rather than the 244×190 photosite array actually present in the Fairchild devices. The overall operation, however, is similar. Further, while the description which follows for the remainder of the specification assumes an n-channel device, it will be apparent that the present invention is equally applicable to a p-channel device.

As depicted in FIG. 3, a photosensitive portion 19 of the interline transfer CCD 18 includes an array of photosites. Upon readout, charge accumulated in the photosites is transferred to vertical registers and shifted, one element at a time, to a horizontal register to yield one horizontal line of video signal. The timing signals and the resulting format of signal information are shown in FIGS. 4a and 4b, respectively. Readout is commenced upon the application of a first gating pulse to a photogate G. For reasons which are discussed in detail below, this causes charge accumulated in the photosite rows corresponding to the even lines (2, 4, 6, 8, 10 and 12) to be dumped into respective vertical registers. The application of clocking pulses to terminals $L_1$ and $L_2$ causes the charge packets in each vertical register to be sequentially shifted to the horizontal register. Then, to form horizontal video line signals the horizontal register is advanced by the application thereto of clocking pulses (not shown) to terminals $H_1$ and $H_2$. This process continues until all even lines are read out, at which time a second gating pulse causes charge accumulated in the photosite rows corresponding to the odd lines (1, 3, 5, 7, 9 and 11) to be dumped into the vertical registers. In a manner similar to that already described, the odd lines of video signal information are produced. The resulting output for one frame of video information is, therefore, a line sequential, field-interlaced video signal (FIG. 4b) suitable for display on a standard video monitor.

The structure of a portion 20 of the device 18 shown in FIG. 3 is depicted in FIGS. 5a, 5b and 5c. As long as a positive potential is applied to the gating electrode G, charges are accumulated in a potential well at each photosite. The potential state of certain of the storage locations of the vertical register is shown in FIGS. 6a and 6b. FIG. 6a illustrates the potential wells in adjacent storage locations when $L_1$ is high (a positive potential) and $L_2$ is low (a less positive potential). FIG. 6b represents the reverse condition. As can be seen from the timing diagram shown in FIG. 4a, the first gating pulse is applied at a time when $L_1$ is high and $L_2$ is low. The potential state of each vertical register is thus as shown in FIG. 6a. This gating pulse brings the potential well of each photosite up to the relative level shown by a broken line 40 in FIG. 6a. Charges are, therefore, transferred from photosites corresponding to even lines (because the potential well in each register segment is deeper than the potential well in the adjacent photosite), but no charge transfer takes place from photosites corresponding to odd lines (because the potential well in each storage location is more shallow than the potential well in the adjacent photosite). During the time interval between the first and second gating pulses, the charge packets transferred to each vertical register are sequentially shifted to the horizontal register and clocked out to produce the even field frame information (FIG. 4b). Upon application of the second gating pulse (FIG. 4a), the potential wells in each vertical register are as shown in FIG. 6b. In this case, therefore, only charges from photosites corresponding to odd lines are transferred to the vertical registers. These charges are then shifted to the horizontal register and clocked out to produce the odd field frame information (FIG. 4b).

In accordance with the present invention, the conventional interline transfer CCD described above is modified for block readout. It is highly desirable to keep structural changes to a minimum, especially in the photosensitive portion 19 of the sensor where defects are prone to occur during manufacture, so that existing processes can still be used in manufacturing the sensor. In accordance with a first embodiment, an interline transfer CCD is so modified for block readout that no changes are required to be made to the photosensitive portion 19 of the sensor. Instead, block readout is achieved by altering certain gate connections, by modifying the clocking signals that drive the sensor, and by replacing the horizontal register with certain output electronics.

A photosensitive portion 50 of a sensor 52 is shown in FIG. 7 that is identical to the corresponding portion 19 of the interline transfer CCD 18 described in connection with FIGS. 3 through 6b. It will be noted that the "vertical" registers shown in FIG. 3 have been re-labeled as "row" registers. Such relabeling reflects a change in the function, but not the structure, of these registers. (The term "row" is used throughout the specification and accompanying claims to mean any linear arrangement, and is not limited to any particular orientation such as "vertical" or "horizontal".) Each row register has a segment proximately disposed in relation to a row of photosites that contains storage locations that are in one-to-one correspondence with the photosites in the proximately disposed photosite row. It will also be noted that the horizontal register shown in FIG. 3 has been eliminated and replaced by output electronics 60 coupled to the photosensitive portion 50 by means of a DC gate 61. A plurality of identical signal processing circuits 62 (discussed in detail below) serve several functions including on-chip signal amplification and re-setting of the row registers during row readout. Lastly, the photogates $g_1$ through $g_9$ are not all connected in common as was the case in the sensor shown in FIG. 3. Rather, the photogates are connected in groups of three.

The clocking signals used to drive the sensor 52 are shown in FIGS. 8a and 8b. These clocking signals, the output electronics 60 and the structural modifications described above, result in block readout of the sensor 52. A block select shift register 54 produces a first gating pulse at a terminal $G_1$ that is electrically connected to photogates $g_1$, $g_2$ and $g_3$. Due to the state of the clocking signals applied to clocking terminals $C_1$ and $C_2$, this gating pulse causes charge accumulated at photosites within the odd columns of rows 1, 2 and 3 to be dumped into respective row registers 1, 2 and 3. In a manner already described above, charge transferred to the row registers is serially shifted to the output electronics 60. It is important to note that all row registers, not just the row registers 1, 2 and 3, are driven by the clocking signals applied to terminals $C_1$ and $C_2$. It follows, therefore, that any charge residing in the ungated row registers 4–9 will also be transferred to the output electronics 60. Such charge is attributable, for example, to blooming. (Blooming occurs when excessive radiation falls on a photosite and charge spills into the register.) As will be seen, this charge is dissipated in the output electronics 60, thereby providing a unique method of blooming control that eliminates the need for antiblooming drains (which require significant chip space) or recombination sites (which lower transfer efficiency).

FIG. 9a shows an electrical schematic of a portion of the output electronics 60 that includes one of the signal processing circuits 62. Because of the extremely low output capacitance of a charge coupled device, the output electronics 60 is preferably placed on the sensor chip itself, rather than being included in the external electronics. The sub-circuit comprised of diffusion diode $D_1$ and transistor $Q_1$ constitutes known sensor output and reset electronics, respectively. Transistors $Q_2$ and $Q_3$ form a source follower amplifier that drives a second source follower amplifier comprised of transistors $Q_5$ and $Q_6$ that is better able to drive the off chip electronics. Transistor $Q_6$ is preferably not manufactured as part of the sensor chip itself but, rather, is included in the external electronics. This construction provides two advantages: First, transistor $Q_4$ draws current only when an output gate transistor $Q_5$ (shown, for example, as $OG_1$, in FIG. 7) is closed, thereby reducing power consumption. Second, the heat generated by transistor $Q_6$ can be dissipated off the chip. Alternatively, however, transistor $Q_6$ can be placed on the sensor chip as shown by broken lines. Both current sources (transistors $Q_3$ and $Q_6$) are connected to a variable ground potential $V_g$ so that their resistances can be optimized.

One implementation of the output electronics 60 is shown in FIG. 9b. Dotted areas represent diffusions, while solid areas represent conductors. The various electrical components are labeled to correspond with FIG. 9a, which is the equivalent circuit. (Two such circuits are shown in FIG. 9b, it being convenient to share certain diffusions.)

After processing by respective signal processing circuits 62, the odd column row signals corresponding to rows 1, 2 and 3 are applied to respective output gates $OG_1$, $OG_2$ and $OG_3$. As will be seen from the timing diagram shown in FIG. 8a, a positive gating pulse applied to a terminal $S_1$ causes output gates $OG_1$, $OG_2$ and $OG_3$ to be closed, thereby passing the applied row signals to respective bonding pads which provide connections for external electronics. During the time in which row signals from rows 1, 2 and 3 are being read out, the remaining output gates $OG_4$ through $OG_9$ are open, so that any signals applied to these gates do not interfere with the row signals for the first three rows. A reset signal is applied to a terminal R that causes a reset potential $V_R$ to be applied to all row registers after each charge packet is shifted to the output electronics 60, thereby eliminating any residual charge residing therein. This includes the charges in row registers 4–9 that result, for example, from blooming.

After the odd column signals have been read out, a second gating pulse produced by the block select shift register 54 is applied to terminal $G_1$ (and thus to photogates $g_1$, $g_2$ and $g_3$). As can be seen from the states of the clocking signals applied to terminals $C_1$ and $C_2$ (FIG. 8b), this second gating pulse causes the even column photosites in the first three rows to be transferred to respective row registers 1, 2 and 3. These even column row signals are read out in a manner similar to that described in connection with readout of the odd column photosites.

The remaining photosite rows are read out in a similar manner: A pair of gating pulses applied to terminal $G_2$ results in readout of photosite rows 4–6, during which time only output gates $OG_4$, $OG_5$ and $OG_6$ are closed. Similarly, a pair of gating pulses applied to terminal $G_3$ results in readout of photosite rows 7, 8 and 9.

The format of the video information so produced is shown in FIG. 8c. The sensor has been read out in three blocks of three photosite rows per block. Further, within each row the odd column information is produced first, followed by even column information. Because the information has been read out in blocks, the resulting frame rate is three times as fast as would result were the sensor read out one row at a time. The frame rate resulting from block readout of the modified interline transfer CCD is also substantially faster than the fastest frame rate obtainable from the unmodified device. This is because, by following the teaching of the invention, the horizontal register, which limits the frame rate of the device shown in FIG. 3, has been eliminated and replaced by output electronics 60 that does not limit the speed at which the sensor is read out.

In accordance with a second embodiment of the invention, the modified sensor shown in FIG. 7 is read out by the application of the clocking signals shown in FIGS. 10a and 10b. In this embodiment, a first gating pulse is applied to terminal $G_1$, thereby causing charge accumulated in odd column photosites of rows 1, 2 and 3 to be transferred to respective row registers during the time period "a" shown in FIG. 10b. As the clocking signals applied to terminals $C_1$ and $C_2$ change state, the transferred charge packets corresponding to odd columns are shifted over one storage location to a register position adjacent the even columns. During a time period "b", a second gating pulse applied to terminal $G_1$ causes charge accumulated in even column photosites to be transferred to respective row registers. The result is that the accumulated charge from respective odd columns and even columns is combined. While the overall block format has not been changed (see FIG. 10c), each row signal is comprised of six (as opposed to twelve) picture elements. By reading out the row signal in pairs of photosites the "horizontal" resolution is thus halved, but certain other advantages result. First, because each picture element corresponds to two photosites, the area of charge integration per photosite has been doubled, thereby doubling the effective sensitivity of the sensor. Also, this method of sensor readout results in a maximum frame rate approximately twice as fast as that obtained when the sensor is read out as described in connection with FIGS. 7 through 8c.

In accordance with a further embodiment, certain structural changes are made to the photosensitive portion 50 of the sensor shown in FIG. 7. As shown in FIG. 11, the photosite structure remains unchanged. Each row register, however, has twice as many storage locations, thereby resulting in an increase in the number of clocking electrodes. Because of the electrical interconnection of the clocking electrodes, a single gating pulse applied to terminal $G_1$ simultaneously transfers charge accumulated in both odd column and even column photosites to respective storage locations. Because each row register has twice the storage locations, there is no mixing of charge from odd column and even column photosites, as in the previous embodiment. The various clocking signals used to drive the sensor are shown in FIGS. 12a and 12b. The overall block format of the resulting video signal remains unchanged, as can be seen from FIG. 12c. In this embodiment, it will be noted that the individual row signals are comprised of twelve picture elements ordered as shown in FIG. 12b.

Figure 14:
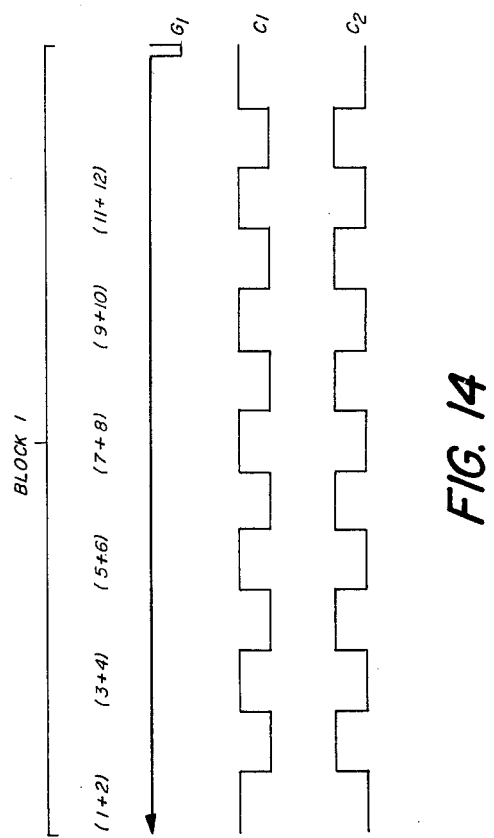
FIGS. 13 and 14 illustrate alternate modifications, in accordance to the present invention, to the device shown in FIG. 7, and to its method of readout.
Figure 13:
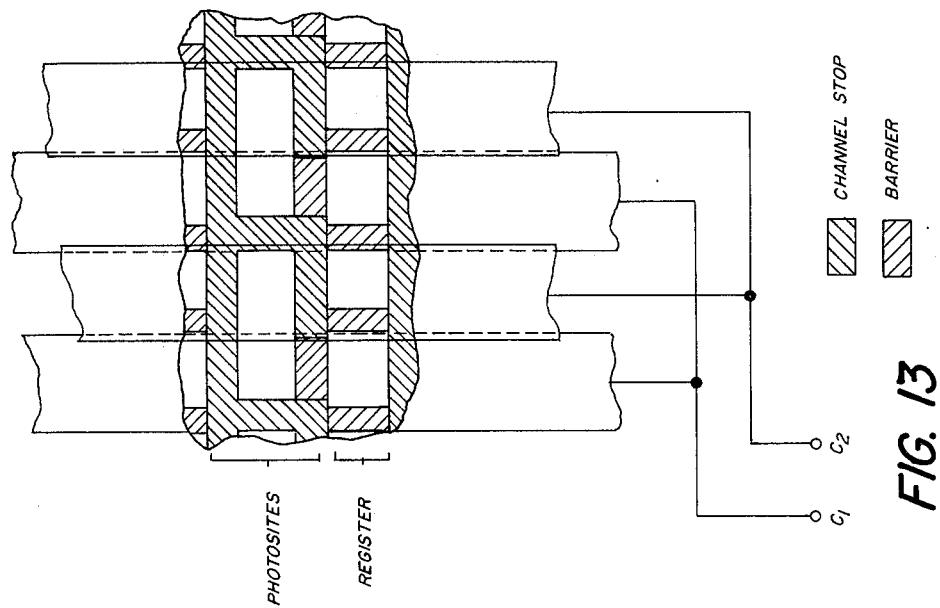

In accordance with a further embodiment shown in FIG. 13, the row registers and associated clocking electrodes remain as shown in FIG. 5a, but every other channel stop between photosites is eliminated. Readout of this device using the clocking signals shown in FIGS. 12a and 14 results in the same overall block format shown in FIG. 12c. But because, in effect, adjacent photosites have been combined, the number of picture elements produced per row is six, instead of twelve. The ordering of the picture elements within a given row is as shown in FIG. 14.

In the above embodiments it has been assumed that the overall sensor size is fixed. Thus, doubling the size of photosites reduced the number of photosites per row by a factor of two. Likewise, doubling the capacity of the row register required the fabrication of smaller clocking electrodes and additional storage locations. It will be apparent to those skilled in the art that the overall size of the sensor can be increased to maintain the total number of photosites, etc.

The above-disclosed embodiments have been directed to the modification of an interline transfer CCD of the general type as the Fairchild CCD201/211. Recently, a meander channel CCD linear image sensor has been disclosed. See Hideo Sei, et al, "A Meander Channel CCD Linear Image Sensor" IEEE Journal of Solid State Circuits, Vol. SC-13, No. 1, p. 66, February 1978. By grouping together a number of such meander channel devices, the photosensitive area of an interline transfer CCD is produced. In accordance with a further embodiment of the invention, such a device is made block readable.

Figure 15A:
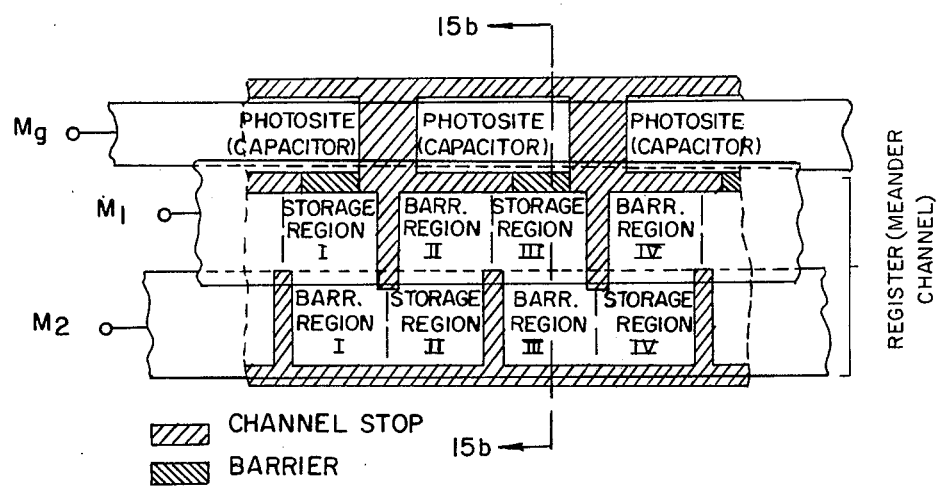
FIGS. 15a, 15b, 15c, 16a, 16b, 16c, 17a and 17b are drawings used to illustrate the operation of a meander channel charge coupled device.
Figures 15B, 15C:
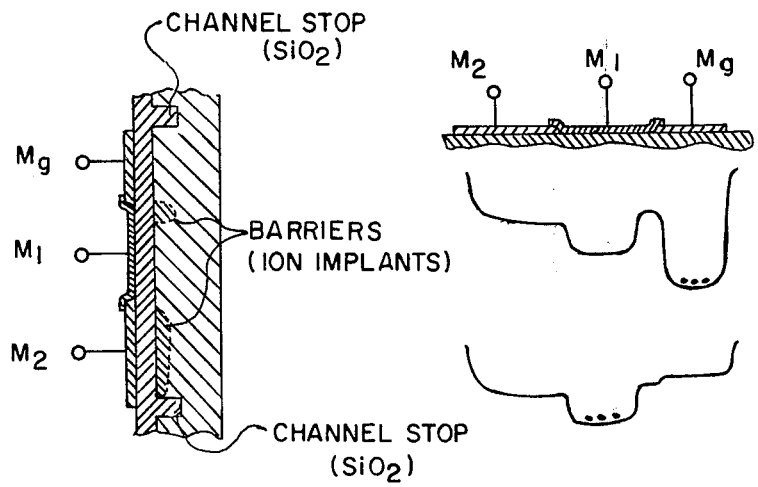
Figure 16A:
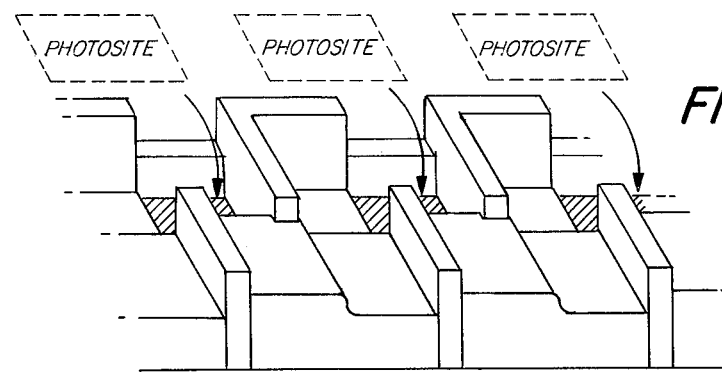

The structure of a meander channel CCD is shown in FIGS. 15a and 15b. In the meander channel CCD, accumulated charge is transferred to a register commonly referred to as a "meander channel." Due to the interdigitated configuration of channel stops, and the location of certain barrier and storage regions, charge accumulated at each photosite (shown in FIG. 15a as a photocapacitor) that has been transferred to a channel beneath electrodes $M_1$ and $M_2$, will "meander" along this channel to an output device. The manner in which charge is transferred from each photocapacitor into a corresponding storage region is illustrated in FIGS. 15c and 16a. During charge integration, charge accumulates in a potential well beneath a photogate terminal $M_G$. Lowering the potential applied to the photogate terminal $M_G$ causes accumulated charge to be transferred to a potential well beneath the channel electrode $M_1$ (storage region I, storage region III, etc.).

Figure 16B:
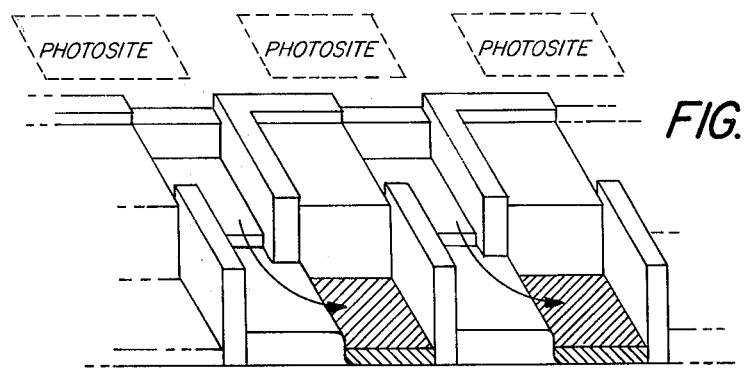
Figure 16C:
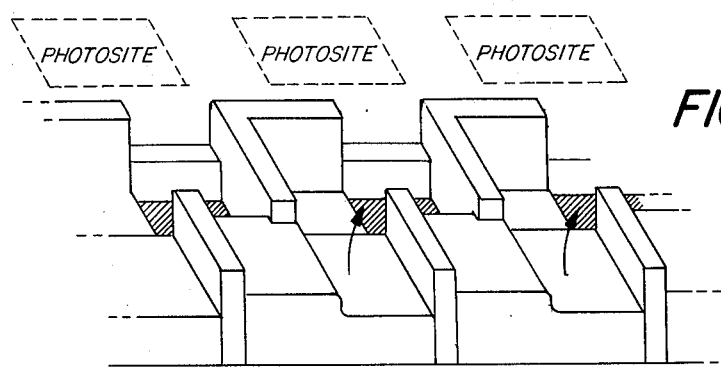

To cause the transferred charge to "meander" down the channel, the potential applied to the channel electrode $M_1$ is lowered (made less positive) while the potential applied to the channel electrode $M_2$ is raised (made more positive). See FIG. 16b. The charge packets are then transferred from storage regions I, III, etc. beneath the channel electrode $M_1$ to storage regions II, IV, etc. beneath the channel electrode $M_2$. The potential on the channel electrode $M_2$ is then raised and that on channel electrode $M_1$ lowered, thereby causing charge packets to be shifted to storage regions of a subsequent stage, e.g., the charge packet from storage region I has been transferred to storage region III. See FIG. 16c. This process continues until all charge packets are advanced the length of the channel.

Figure 17A:
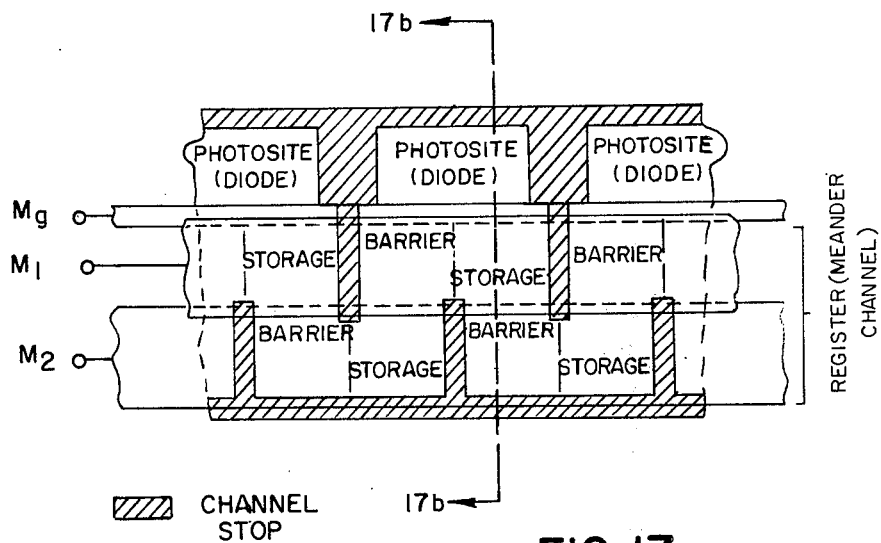
Figure 17B:
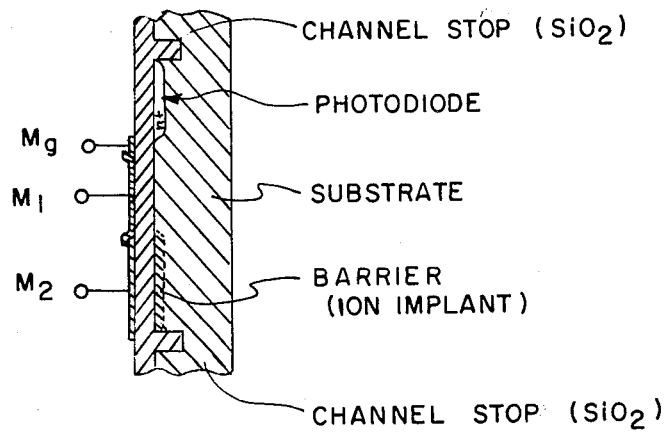

In a different type of meander channel device, illustrated in FIGS. 17a and 17b, photodiodes are used as the photosensitive element. In this case, the gating electrode $M_G$ is used to provide a potential barrier between the photodiode and the storage regions in the meander channel. A low voltage on $M_G$ will form the barrier whereas a high voltage allows transfer. In all other respects, the operation is identical to that of the photocapacitor meander device described above.

Figure 18:
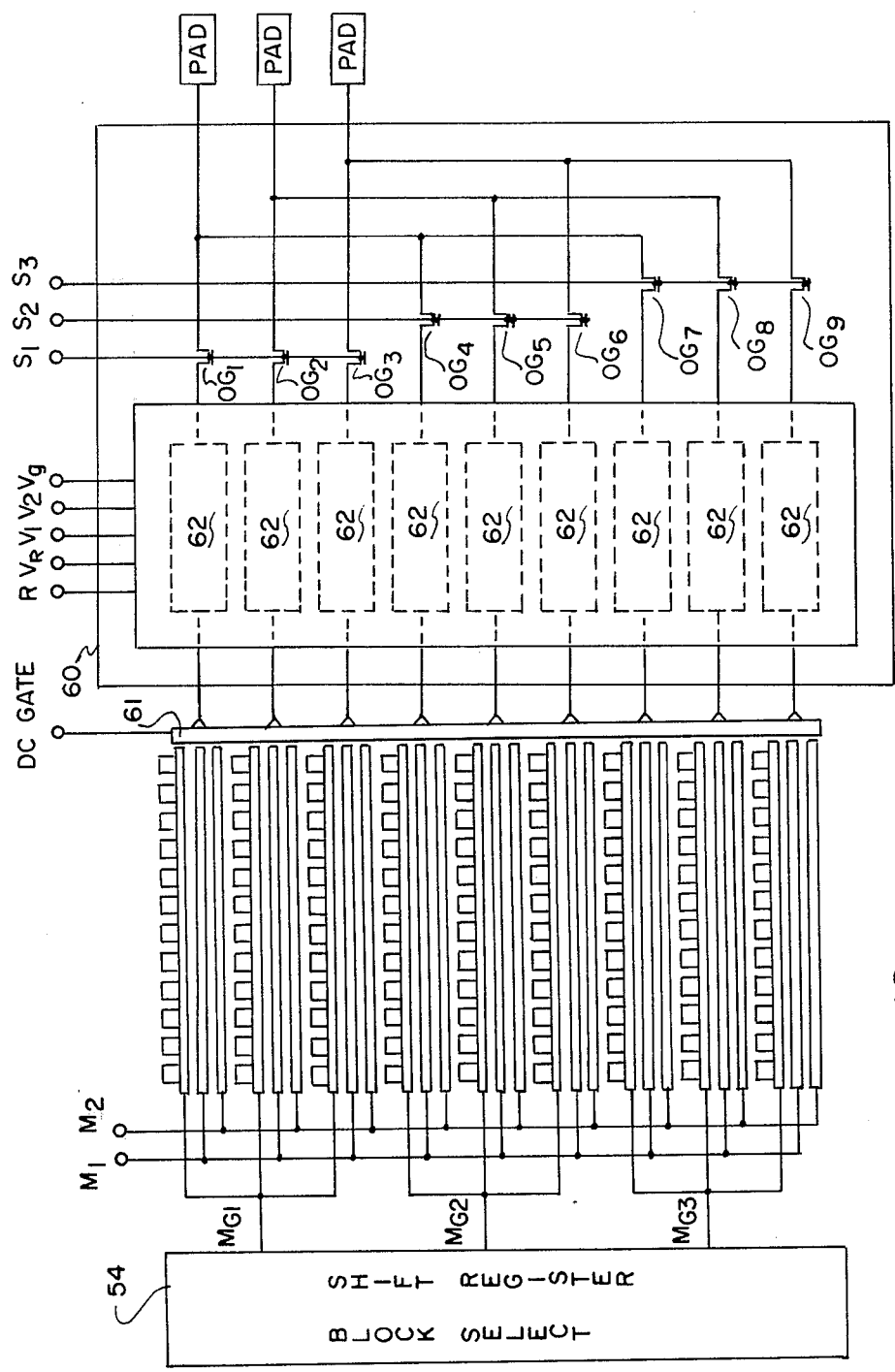

FIG. 18 shows a meander channel, interline transfer CCD designed, in accordance with the invention, for block readout. The description which follows applies both to photocapacitor and photodiode meander channel devices (with the exception, as noted above, relating to the polarity of the gating signal applied to the photogate terminal $M_G$). FIGS. 19a and 19b are timing diagrams showing the clocking signals used to read out the sensor. A gating pulse applied to the photogate terminal $M_{G1}$ causes charge accumulated at each photosite in rows 1, 2 and 3 to be transferred to respective meander channels. Clocking signals applied to electrodes $M_1$ and $M_2$ cause transferred charge to be shifted to the output electronics 60, which electronics is identical to that already described. Because the clocking electrodes for all meander channels (rows 1 through 9) are connected, any charge residing in any of the meander channels will be shifted to the output electronics. Any charge in the meander channels corresponding to rows 4 through 9 represents charge due, for example, to blooming and is dissipated in the output electronics as previously described. Antiblooming control is, therefore, inherent in this block readout technique. It should be noted that if blooming control is not desired, separate channel electrode connections can be provided for each block of photosite rows. The format of the resulting video signal is in block format (FIG. 19c), with each row comprised of twelve ordered picture elements (FIG. 19b).

The invention has been described in detail with particular reference to certain preferred embodiments thereof, but it will be understood that variations and modifications can be effected within the spirit and scope of the invention.

What is claimed is:

1. Block readable area image sensor apparatus of the charge coupled interline transfer type comprising:
   (a) a plurality of side by side photosite row structures, each of which has (1) a row of photosites for accumulating signal charge in response to incident radiation, (2) a row register proximately disposed in relation to said row of photosites, and (3) a selectively actuable photogate for effecting charge transfer from said photosites to said row register;
   (b) means for applying clocking signals to said row registers for reading out charge therein; and
   (c) means for electrically connecting predetermined pluralities of said photogates to form blocks of interconnected photosite row structures so that the photogates of all the photosite row structures in a block are simultaneously actuable, said means for applying clocking signals being effective for reading out charge simultaneously from at least all the row registers in a selectively actuated block.

2. Sensor apparatus as claimed in claim 1 wherein said photogate is effective to transfer excess charge to said row register when a photosite is full, wherein said means for applying clocking signals is effective to read out all of said row registers simultaneously, and wherein said sensor apparatus further comprises output electronics that includes means for dissipating charges read out from those photosite row structures which are not selectively actuated, thereby providing blooming control.

3. Sensor apparatus as claimed in claim 1 further comprising output electronics including (1) a plurality of processing circuits for processing charge from said photosite row structures, (2) means for selecting processed signal charge from actuated photosite row structures, and (3) means for dissipating charge read out from nonactuated photosite row structures.

4. Sensor apparatus as claimed in claim 1 further comprising a block select shift register for sequentially applying a gating signal to respective blocks of interconnected photosite row structures to thereby selectively actuate the photogates in the photosite row structures to effect signal charge transfer from photosites to row registers within said selectively actuated photosite row structures.

5. Sensor apparatus as claimed in claim 4 further comprising:
   (1) a plurality of processing circuits for processing charge read out from said photosite row structures to produce a processed charge signal;
   (2) a plurality of output gates operable between an open state that is not effective to pass an electrical signal applied thereto, and a closed state effective to pass an electrical signal applied thereto;
   (3) means for electrically connecting the processed charge signal from each of said processing circuits to a respective output gate; and
   (4) means for controlling the states of said output gates so that output gates having processed charge signals applied thereto that were developed from selectively actuated photosite row structures are in the closed state, while the remaining output gates are in the open state.

6. Block readable area image sensor apparatus of the charge coupled interline transfer type comprising:
   (a) an array of photosites arranged side by side in rows thereof for accumulating signal charge in response to incident radiation;
   (b) a plurality of row registers interspersed between said rows of photosites, each of which has a portion proximately disposed in relation to one of said rows of photosites, each of said row register portions having storage locations that are in one-to-one correspondence with the photosites in the proximately disposed row of photosites;
   (c) a plurality of photogates, each of which initiates the transfer of signal charge from a row of photosites to a corresponding row register upon the application thereto of a gating signal;
   (d) means for reading out charge from said row registers; and
   (e) means for electrically connecting predetermined sub-pluralities of said photogates to form blocks comprising the sub-plurality of photogates and associated photosite rows and row registers so that signal charge is transferred simultaneously from all the rows of photosites in one of said blocks in response to the application of a gating signal to the photogates thereof, said means for reading out charge being effective for reading out charge simultaneously from all of the row registers in a block.

7. Sensor apparatus as claimed in claim 6 further comprising means for sequentially applying a gating signal to respective sub-pluralities of electrically connected photogates.

8. Sensor apparatus as claimed in claim 6 wherein said photogates are effective to transfer excess charge to said row registers when a photosite is full, wherein said row register readout means is effective to read out all of said row registers simultaneously, and wherein said sensor apparatus further comprises means for dissipating charge read out from all row registers except those that have had a gating signal applied to their corresponding photogate, thereby providing blooming control.

9. Sensor apparatus as claimed in claim 8 further comprising:
   multi-channel signal processing electronics for individually processing charge signals from said row registers; and
   means for selecting those processed charge signals corresponding to photosite row information, and for dissipating the remainder of said processed charge signals.

10. Block readable area image sensor apparatus of the charge coupled interline transfer type comprising:
   (a) a plurality of side by side rows of photosites for accumulating charge in response to incident radiation;
   (b) a plurality of row registers interspersed between said rows of photosites, each of which has a segment that is proximately disposed in relation to one of said rows of photosites, each of said row register segments having storage locations that are in one-to-one correspondence with the photosites in the proximately disposed photosite row;
   (c) a plurality of photogates, each of which initiates charge transfer from a row of photosites to a corresponding row register upon the application thereto of a gating signal;
   (d) means for sequentially applying a gating signal to respective sub-pluralities of said photogates so that charge is transferred simultaneously to the corresponding sub-plurality of row registers, said means for reading out charge being effective for reading out charge simultaneously from all the row registers in said corresponding sub-plurality of row registers, whereby said sensor is readable in blocks of photosite rows.

11. Block readable area image sensor apparatus of the charge coupled interline transfer type comprising:
   (a) a plurality of side by side rows of photosites for accumulating charge in response to incident radiation;
   (b) a plurality of row registers interspersed between said rows of photosites, each of which has a segment that is proximately disposed in relation to one of said rows of photosites, each of said row register segments having at least twice as many storage locations as there are photosites within the proximately disposed photosite row;
   (c) a plurality of photogates, each of which initiates charge transfer from a row of photosites to a corresponding row register upon the application thereto of a gating signal;
   (d) means for reading out charge from said row registers; and
   (e) means for sequentially applying a gating signal to respective sub-pluralities of said photogates so that charge is transferred simultaneously to the corresponding sub-plurality of row registers, said means for reading out charge being effective for reading out charge simultaneously from all the row registers in said corresponding sub-plurality of row registers, whereby said sensor is readable in blocks of photosite rows.

12. Block readable area image sensor apparatus of the charge coupled interline transfer type comprising:
   (a) a plurality of side by side meander channel charge coupled devices, each of which includes (1) a row of photosites for accumulating signal charge in response to incident radiation, (2) a meander channel into which signal charges are transferred from said photosites, and (3) a photogate structure to which a gating signal is applied to effect transfer of signal charges from said photosites to said meander channel;
   (b) means for reading out charge from said meander channels; and
   (c) means for electrically connecting predetermined sub-pluralities of said photogate structures to form blocks of meander channel charge coupled devices in which all of the signal charges may be simultaneously transferred from said photosites to said meander channels, said means for reading out charge being effective for reading out charge simultaneously from all the meander channels in a block so that said sensor apparatus can be read out in blocks of meander channel charge coupled devices.

13. Sensor apparatus as claimed in claim 12 wherein said photogate structures are effective to transfer excess charge to said meander channel when a photosite is full, wherein said meander channel reading means is effective to read out all meander channels simultaneously, and wherein said sensor apparatus further comprises means for dissipating charge from those meander channels that did not have a gating signal applied to their corresponding photogate structures, thereby providing blooming control.

14. A method for reading a charge coupled interline transfer device of a type comprised of a plurality of photosite row structures, each of which structures includes a row register and a row of photosites for accumulating signal charge in response to incident radiation, said method comprising the steps of:
   (a) sequentially transferring signal charge simultaneously from predetermined sub-pluralities of rows of photosites to row registers respective of the rows within said sub-pluralities thereof; and
   (b) simultaneously reading out said signal charge from all of said row registers in a sub-plurality of row structures to produce a block format output signal wherein each block is comprised of information from a respective sub-plurality of photosite row structures.

15. A method as claimed in claim 14 wherein said chrge coupled device further comprises means for allowing excess photocharge to overflow from said photosites into said row registers, and wherein the step of reading out charge from said row registers is such that all row registers are read out simultaneously, and wherein said method further comprises the step of dissipating all charge that does not represent signal charge, thereby providing blooming control.

16. A method as claimed in claims 14 or 15 wherein each of said photosite row structures is read by:
   (1) transferring signal charge from alternate photosites within a row of photosites to its corresponding row register;
   (2) reading out said transferred signal charge corresponding to alternate photosites from the row register;
   (3) transferring signal charge from the remaining photosites within the row of photosites to the row register; and
   (4) reading out said transferred signal charge corresponding to remaining photosites from the row register.

17. A method as claimed in claims 14 or 15 wherein each of said photosite row structures is read by:
(1) transferring signal charge from alternate photosites within a row of photosites to respective storage location in a row register;
(2) advancing said transferred signal charge to further respective storage locations for combination with charge from the remaining photosites in the row of photosites.

* * * * *